United States Patent
Saitoh et al.

(10) Patent No.: US 10,269,831 B2
(45) Date of Patent: Apr. 23, 2019

(54) SEMICONDUCTOR DEVICE INCLUDING A PLURALITY OF THIN-FILM TRANSISTORS WITH ONE THIN-FILM TRANSISTOR INCLUDING TWO GATE ELECTRODES

(71) Applicant: Sharp Kabushiki Kaisha, Osaka-shi, Osaka (JP)

(72) Inventors: Takao Saitoh, Osaka (JP); Seiji Kaneko, Osaka (JP); Yohsuke Kanzaki, Osaka (JP); Yutaka Takamaru, Osaka (JP); Keisuke Ide, Osaka (JP); Takuya Matsuo, Osaka (JP); Shigeyasu Mori, Osaka (JP); Hiroshi Matsukizono, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/039,118

(22) PCT Filed: Aug. 26, 2014

(86) PCT No.: PCT/JP2014/072298
§ 371 (c)(1),
(2) Date: May 25, 2016

(87) PCT Pub. No.: WO2015/079756
PCT Pub. Date: Jun. 4, 2015

(65) Prior Publication Data
US 2017/0162602 A1    Jun. 8, 2017

(30) Foreign Application Priority Data

Nov. 26, 2013 (JP) ................................ 2013-244228

(51) Int. Cl.
*H01L 27/12* (2006.01)
*H01L 29/04* (2006.01)
(Continued)

(52) U.S. Cl.
CPC ........ *H01L 27/1225* (2013.01); *H01L 27/124* (2013.01); *H01L 27/1248* (2013.01);
(Continued)

(58) Field of Classification Search
CPC ............. H01L 29/7869; H01L 27/1225; H01L 29/78648; H01L 29/42384;
(Continued)

(56) References Cited

U.S. PATENT DOCUMENTS

2010/0006834 A1* 1/2010 Kim .................. H01L 29/78696
257/43
2010/0244029 A1   9/2010 Yamazaki et al.
(Continued)

FOREIGN PATENT DOCUMENTS

JP    2010-021555 A    1/2010
JP    2010-251735 A    11/2010
(Continued)

OTHER PUBLICATIONS

Official Communication issued in International Patent Application No. PCT/JP2014/072298, dated Nov. 11, 2014.

*Primary Examiner* — Nduka E Ojeh
(74) *Attorney, Agent, or Firm* — Keating & Bennett, LLP

(57) ABSTRACT

A semiconductor device includes, a plurality of oxide semiconductor TFTs including a first gate electrode, a first insulating layer in contact with the first gate electrode, an oxide semiconductor layer opposing the first gate electrode via the first insulating layer, a source electrode and a drain electrode which are connected with the oxide semiconductor layer, and an organic insulating layer covering only some of the plurality of oxide semiconductor TFTs, wherein the plurality of oxide semiconductor TFTs include a first TFT which is covered with the organic insulating layer and a second TFT which is not covered with the organic insulating
(Continued)

layer, and the second TFT includes a second gate electrode opposing the oxide semiconductor layer via a second insulating layer, the second gate electrode being arranged to overlap with at least a portion of the first gate electrode with the oxide semiconductor layer interposed therebetween.

10 Claims, 6 Drawing Sheets

(51) Int. Cl.
  H01L 29/24 (2006.01)
  H01L 29/786 (2006.01)
  H01L 29/10 (2006.01)
  H01L 29/12 (2006.01)
(52) U.S. Cl.
  CPC .............. *H01L 29/04* (2013.01); *H01L 29/24* (2013.01); *H01L 29/7869* (2013.01); *H01L 29/78648* (2013.01); *H01L 29/78693* (2013.01); *H01L 29/78696* (2013.01)
(58) Field of Classification Search
  CPC ......... H01L 29/78645; H01L 29/78606; H01L 29/78696; H01L 27/124
  USPC .................. 257/43, 59, 40; 438/104, 158
  See application file for complete search history.

(56) References Cited

U.S. PATENT DOCUMENTS

| | | | |
|---|---|---|---|
| 2010/0301326 A1* | 12/2010 | Miyairi | H01L 27/1225 257/43 |
| 2011/0058116 A1* | 3/2011 | Yamazaki | H01L 27/1225 349/43 |
| 2012/0138922 A1 | 6/2012 | Yamazaki et al. | |
| 2013/0099229 A1 | 4/2013 | Wakana et al. | |
| 2013/0188110 A1 | 7/2013 | Miyamoto | |
| 2015/0206950 A1* | 7/2015 | Chen | H01L 29/7869 257/43 |
| 2015/0236687 A1 | 8/2015 | Shimada et al. | |

FOREIGN PATENT DOCUMENTS

| | | |
|---|---|---|
| JP | 2012-084572 A | 4/2012 |
| JP | 2012-134475 A | 7/2012 |
| JP | 2013-084619 A | 5/2013 |
| JP | 2013-149995 A | 8/2013 |
| WO | 2011/132769 A1 | 10/2011 |
| WO | 2012/032749 A1 | 3/2012 |
| WO | 2014/042116 A1 | 3/2014 |

* cited by examiner (a)

(b)

SEMICONDUCTOR DEVICE INCLUDING A PLURALITY OF THIN-FILM TRANSISTORS WITH ONE THIN-FILM TRANSISTOR INCLUDING TWO GATE ELECTRODES

TECHNICAL FIELD

The present invention relates to a semiconductor device formed using an oxide semiconductor and, for example, to an active matrix substrate for use in liquid crystal display devices and organic EL display devices.

BACKGROUND ART

An active matrix substrate for use in liquid crystal display devices, or the like, includes a switching element, such as a thin film transistor (hereinafter, "TFT"), in each pixel. Examples of such a switching element which have been conventionally used in various applications include a TFT which includes an amorphous silicon film as the active layer (hereinafter, "amorphous silicon TFT") and a TFT which includes a polycrystalline silicon film as the active layer (hereinafter, "polycrystalline silicon TFT").

In recent years, using materials other than amorphous silicon and polycrystalline silicon as the material of the active layer of TFTs has been attempted. For example, Patent Document 1 discloses a liquid crystal display device in which the active layer of TFTs is formed using an oxide semiconductor film of InGaZnO (an oxide consisting of indium, gallium and zinc), or the like. Such a TFT is referred to as "oxide semiconductor TFT".

The oxide semiconductor TFT is capable of operating at a higher speed than the amorphous silicon TFT. The oxide semiconductor film is manufactured through a simpler process than the polycrystalline silicon film and is therefore applicable to devices which require a large area. Therefore, application of the oxide semiconductor TFT, as a high-performance active element which can be manufactured with reduced manufacturing steps and a reduced manufacturing cost, to display devices, and the like, has been encouraged.

Since the mobility of the oxide semiconductor is high, it is possible to achieve equal or higher performance even if the size is reduced as compared with conventional amorphous silicon TFTs. Therefore, when an active matrix substrate of a display device is manufactured using the oxide semiconductor TFT, the area occupancy of the TFT in each pixel can be reduced, and the pixel aperture ratio can be improved. Accordingly, even when the amount of light from the backlight is reduced, bright display can be realized, and low power consumption can be realized.

Particularly in small-size, high-resolution display devices for use in smartphones and the like, it is difficult to increase the pixel aperture ratio due to, for example, limitations on the minimum width of wires (process rules). In view of such, if the pixel aperture ratio is improved by using the oxide semiconductor TFT, display of high-resolution images can be realized while the power consumption is reduced even in small-size display devices.

Since the off-leak characteristic of the oxide semiconductor TFT is excellent, it is possible to utilize an operation mode where display is performed with reduced image rewriting frequency. For example, in the case of displaying a still image, it is possible to operate the TFT so as to rewrite the image data once every second. Such a driving method is referred to as "intermittent driving" or "low frequency driving" and is capable of greatly reducing the power consumption by the display device.

CITATION LIST

Patent Literature

Patent Document 1: Japanese Laid-Open Patent Publication No. 2012-134475
Patent Document 2: Japanese Laid-Open Patent Publication No. 2010-251735
Patent Document 3: Japanese Laid-Open Patent Publication No. 2013-84619
Patent Document 4: WO 2011/132769

SUMMARY OF INVENTION

Technical Problem

Various methods for controlling the threshold of the gate voltage of the oxide semiconductor TFT (threshold voltage Vth) have been studied for the purpose of stabilizing the operation. When threshold voltage Vth is shifted from a desired value (e.g., 0 V) to the negative side, an operation failure occurs such that an electrical conduction occurs between the source and the drain even during an off period of the TFT, falling into a normally-on state. The shift of threshold voltage Vth is caused by, for example, entry of external moisture or the like into an oxide semiconductor layer during an annealing step which is carried out for improving the element characteristics of the oxide semiconductor layer. The threshold shift can also be caused by repetition of a switching operation or unintended irradiation of the oxide semiconductor layer with light. Further, in some cases, a plurality of TFTs have different threshold voltages due to dimensional errors which occur in the manufacturing process, so that the threshold voltage relatively shifts.

Regarding this problem, Patent Document 2 discloses the technique of using an additional electrode which is provided so as to oppose the gate electrode with a semiconductor layer interposed therebetween (sometimes referred to as "back-gate electrode" or "second gate electrode") in an oxide semiconductor TFT in which an In—Ga—Zn—O based semiconductor is used. Using the back-gate electrode enables to compensate for the threshold shift of the oxide semiconductor TFT. Therefore, a more stable operation of the oxide semiconductor TFT can be expected.

However, if a configuration where a back-gate electrode is provided in a TFT which is provided in a pixel (hereinafter, sometimes referred to as "pixel TFT") is employed in a display device, there is a probability that the pixel aperture ratio decreases. Although it is desirable that the back-gate electrode is connected with, for example, a gate electrode in a lower layer or another wire and a predetermined voltage is applied to the back-gate electrode, the size of the TFT can increase when such a configuration is realized. Therefore, as for the pixel TFT, controlling the threshold voltage by the back-gate electrode is not preferred in some cases.

Meanwhile, the technique of monolithically (integrally) providing driving circuits, such as a gate driver and a source driver, on a substrate in a non-display region lying outside the display region in which pixels are provided (frame region) has been known. These driving circuits (monolithic driver) are usually formed using TFTs. Recently, the technique of forming a monolithic driver on the substrate using oxide semiconductor TFTs is used. This technique enables to realize a narrower frame region and to simplify the mounting process, thereby realizing a cost reduction.

Usually, TFTs which are constituents of the driving circuits (hereinafter, sometimes referred to as "peripheral circuit TFTs") are simultaneously manufactured in the process of manufacturing the pixel TFTs. Therefore, in many cases, peripheral circuit TFTs and pixel TFTs have the same or similar structures. However, in some cases, some of the peripheral circuit TFTs have to be severely controlled as to the variation of the threshold as compared with the pixel TFTs. In such a case, if the threshold variation of the peripheral circuit TFTs is suppressed by the same means as the pixel TFTs, the peripheral circuit TFTs cannot carry out a desired operation in some cases.

As described above, in a semiconductor device which includes oxide semiconductor TFTs, there is the problem of appropriately controlling the threshold voltages of TFTs configured for various uses.

The present invention was conceived for solving the above-described problem. One of the objects of the present invention is to provide a semiconductor device including oxide semiconductor TFTs which have improved element characteristics.

Solution to Problem

A semiconductor device of an embodiment of the present invention includes: a substrate; a plurality of oxide semiconductor TFTs provided on the substrate, each of the plurality of oxide semiconductor TFTs including a first gate electrode, a first insulating layer which is in contact with the first gate electrode, an oxide semiconductor layer arranged so as to oppose the first gate electrode via the first insulating layer, and a source electrode and a drain electrode which are connected with the oxide semiconductor layer; and an organic insulating layer covering only some of the plurality of oxide semiconductor TFTs, wherein the plurality of oxide semiconductor TFTs include a first TFT which is covered with the organic insulating layer and a second TFT which is not covered with the organic insulating layer, and the second TFT further includes a second gate electrode arranged so as to oppose the oxide semiconductor layer via a second insulating layer, when viewed in a direction normal to the substrate, the second gate electrode being arranged so as to overlap with at least part of the first gate electrode with the oxide semiconductor layer interposed therebetween.

In one embodiment, the first TFT does not include the second gate electrode.

In one embodiment, the semiconductor device has a display region in which a plurality of pixels are arranged and a non-display region surrounding the display region, wherein the first TFT is provided in the display region, and the second TFT is provided in the non-display region.

In one embodiment, the organic insulating layer is arranged so as to selectively cover only the display region, the first TFT is included in one of the plurality of pixels in the display region, and the second TFT is included in a gate driver integrally formed on the substrate in the non-display region.

In one embodiment, a third TFT which does not have the second gate electrode is provided separately from the second TFT in the non-display region.

In one embodiment, the semiconductor device further includes a transparent electrode provided above the organic insulating layer, wherein the second gate electrode is made of the same material as that of the transparent electrode.

In one embodiment, the oxide semiconductor layer includes a first semiconductor layer which is provided on a side close to the first gate electrode, the first semiconductor layer having a first mobility, and a second semiconductor layer which is in contact with the first semiconductor layer and which is provided on a side distant from the first gate electrode, the second semiconductor layer having a second mobility which is lower than the first mobility.

In one embodiment, the second gate electrode is electrically connected with any of wires for applying separate voltages to the source electrode, the first gate electrode, and the second gate electrode of the oxide semiconductor TFT.

In one embodiment, the oxide semiconductor layer includes an In—Ga—Zn—O based semiconductor.

In one embodiment, the In—Ga—Zn—O based semiconductor includes a crystalline portion.

A semiconductor device of another embodiment of the present invention includes: a substrate; and a plurality of oxide semiconductor TFTs provided on the substrate, each of the plurality of oxide semiconductor TFTs including a first gate electrode, a first insulating layer which is in contact with the first gate electrode, an oxide semiconductor layer arranged so as to oppose the first gate electrode via the first insulating layer, and a source electrode and a drain electrode which are connected with the oxide semiconductor layer, wherein the oxide semiconductor layer includes a first semiconductor layer which is provided on a side close to the first gate electrode, the first semiconductor layer having a first mobility, and a second semiconductor layer which is in contact with the first semiconductor layer and which is provided on a side distant from the first gate electrode, the second semiconductor layer having a second mobility which is lower than the first mobility, the plurality of oxide semiconductor TFTs include a first TFT and a second TFT, the second TFT includes a second gate electrode arranged so as to oppose the oxide semiconductor layer via a second insulating layer, when viewed in a direction normal to the substrate, the second gate electrode being arranged so as to overlap with at least part of the first gate electrode with the oxide semiconductor layer interposed therebetween, and the first TFT does not include the second gate electrode.

In one embodiment, the semiconductor device has a display region in which a plurality of pixels are arranged and a non-display region surrounding the display region, wherein the first TFT is provided in the display region, and the second TFT is provided in the non-display region.

In one embodiment, the second TFT is included in a gate driver provided in the non-display region, and the first TFT is included in a pixel provided in the display region.

In one embodiment, the first semiconductor layer has a thickness of not less than 10 nm, and the second semiconductor layer has a thickness of not less than 20 nm.

In one embodiment, a Ga concentration in the second semiconductor layer is higher than a Ga concentration in the first semiconductor layer.

Advantageous Effects of Invention

According to an embodiment of the present invention, a TFT substrate can be realized which includes oxide semiconductor TFTs which have excellent element characteristics.

DESCRIPTION OF EMBODIMENTS

Figure 1:
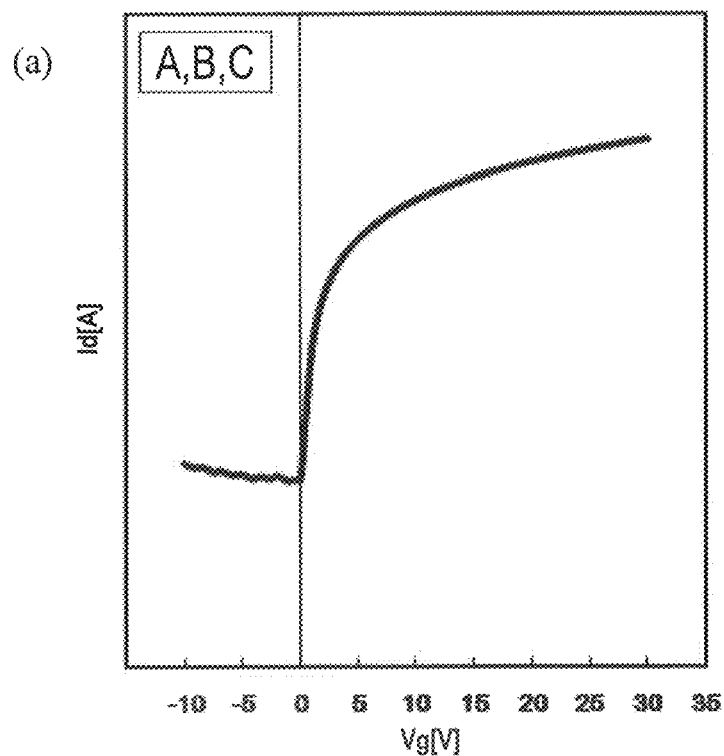
FIG. 1 Graphs showing the threshold of an oxide semiconductor TFT. (a) shows a state where a threshold shift is suppressed. (b) shows a state where a threshold shift is caused.
Figure 1:
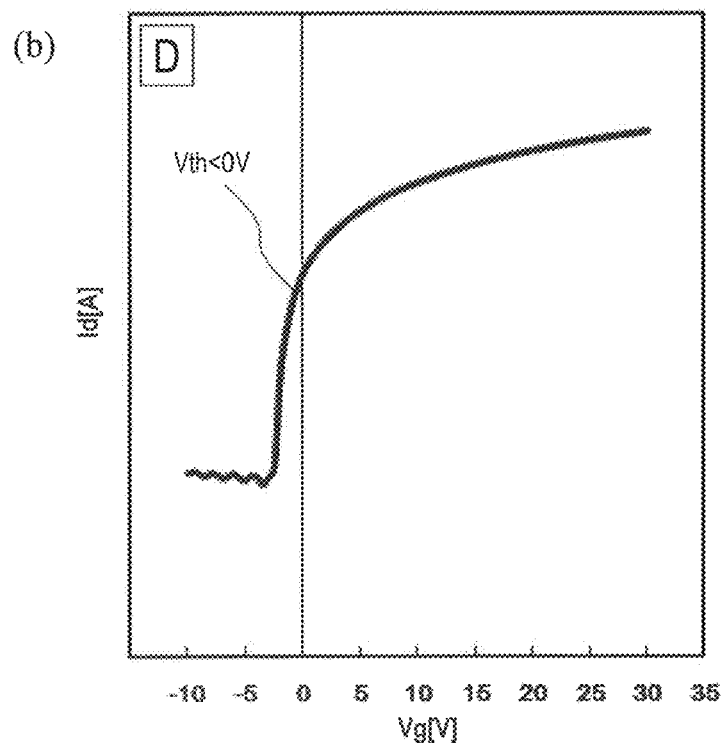

Hereinafter, as a semiconductor device according to an embodiment of the present invention, a TFT substrate (active matrix substrate) for use in a display device is described with reference to the drawings. Note that the semiconductor device of the present invention includes an active matrix substrate, a display device including the active matrix substrate, and various other devices.

First, the main points of the TFT substrate of one embodiment of the present invention are described.

As described above, the TFT substrate has a display region and a frame region lying outside the display region. In the display region, a pixel TFT is provided in each of a plurality of pixels. In the frame region, a plurality of peripheral circuit TFTs are provided which are constituents of a monolithic driver circuit.

In the display region, a configuration can be employed where the pixel TFTs are covered with a passivation layer (typically, an inorganic insulating layer which is made of SiNx, SiO$_2$, or the like, and which has a thickness of, for example, several hundreds of nanometers) and an organic insulating layer, and a pixel electrode provided above the organic insulating layer is connected with a TFT through a contact hole. The organic insulating layer (also referred to as "organic interlayer insulating layer") has a relatively large thickness of, for example, about 2-3 μm and is used for flattening the surface of the upper layer of the pixel TFT and for reducing the static capacitance formed between the pixel electrode and a source wire or the like.

As for a case where an organic insulating layer is provided as described above, a configuration where a back-gate electrode for suppressing the variation of the threshold voltage is provided on the organic insulating layer has been known (for example, Patent Document 2). However, when the back-gate electrode is provided on the organic insulating layer, the organic insulating layer which has a relatively large thickness intervenes between the semiconductor layer and the back-gate electrode. Accordingly, the effect of suppressing the variation of the threshold voltage decreases, and there is a probability that the threshold control by the back-gate electrode cannot be appropriately achieved.

In view of such, in order to more surely control the threshold voltage, a configuration where a back-gate electrode is provided while the organic insulating layer is not provided is possible. For example, a buffer transistor included in the gate driver (a transistor whose drain is connected with a gate wire extending inside the display region) is a TFT which has a small margin for the threshold variation and is preferably severely controlled as to the threshold voltage. The threshold shift of the buffer transistor occurs on the negative side in many cases. The buffer transistor is likely to fall into a normally-on state when the threshold voltage is less than 0 V. In such a transistor, it is preferred that the TFT is not covered with the organic insulating layer and the back-gate electrode provided on the passivation layer is used for controlling the threshold voltage.

Meanwhile, as for the pixel TFTs, from the viewpoint of preventing decrease of the aperture ratio, it is difficult in some cases to provide the back-gate electrode as described above. Also, the peripheral circuit TFTs can include TFTs in which it is difficult to secure a space for the back-gate electrode.

In view of such, in specific TFTs, for example the pixel TFTs, employing a configuration where a back-gate electrode is not provided can be considered. However, it was found from the results of experiments carried out by the present inventors that, when employing a configuration where a back-gate electrode is not provided and an organic insulating layer is not provided as in the above-described peripheral TFT, normal element characteristics cannot be achieved in some of the TFTs in some cases. We estimate that this is because, when not covered with an organic insulating layer, the effects of an overlying layer of the passivation layer that covers the TFTs on the channel portion of the TFTs increase, so that the threshold shifts to the negative side.

Based on such knowledge, the present inventors found that, in order to appropriately control all the threshold voltages of the pixel TFTs and the peripheral circuit TFTs, it is preferred that at least two types of TFT configurations, a TFT configuration which includes a back-gate electrode although not covered with an organic insulating layer and a TFT configuration which is covered with an organic insulating layer, are provided together on the same active matrix substrate. According to such a solution, the threshold of each TFT can be appropriately controlled without making great changes or additions to the conventional manufacturing process, and therefore, this solution is also advantageous in terms of the cost.

In an embodiment of the present invention, typically, all of TFTs which do not have a back-gate electrode are covered with an organic insulating layer. That is, in an arbitrary TFT, at least any one of a back-gate electrode and an organic insulating layer is provided, and in this configuration, only some of a plurality of TFTs are covered with the organic insulating layer.

Table 1 presented below shows what the TFT characteristic was like for each of the combinations of the presence/absence of the back-gate electrode and the presence/absence of the organic insulating layer.

TABLE 1

| TFT characteristic (OK: Vth ≥ 0 V, NG: including area of Vth < 0 V) | | |
|---|---|---|
|  | WITH BACK GATE | WITHOUT BACK GATE |
| WITH ORGANIC INSULATING FILM | OK | OK |

TABLE 1-continued

TFT characteristic (OK: Vth ≥ 0 V, NG: including area of Vth < 0 V)

|  | WITH BACK GATE | WITHOUT BACK GATE |
|---|---|---|
| WITHOUT ORGANIC INSULATING FILM | OK | NG |

As seen from Table 1, in some cases, a TFT which did not have a back-gate structure and which was not covered with an organic insulating layer had a normally-on TFT characteristic (Vth<0), which is indicated by "NG" in the table, and it was difficult to carry out a normal operation. On the other hand, as for a TFT to which at least any of a configuration including a back-gate structure and a configuration covered with an organic insulating layer was applied, Vth≥0 holds, which is indicated by "OK" in the table, and a normal operation was carried out. The characteristic of a TFT which included a back-gate structure and which was covered with an organic insulating layer was also "OK".

It is seen from this result that, by respectively applying multiple types of element configurations to a plurality of TFTs provided on the substrate, desired characteristics can be achieved in all of the TFTs even when TFTs in which it is difficult to provide a back-gate electrode are included.

For the sake of reference only, FIGS. 1(a) and 1(b) show the relationship between the applied voltage and the drain current amount for each of Case A (with back gate, with organic insulating film), Case B (with back gate, without organic insulating film), Case C (without back gate, with organic insulating film), and Case D (without back gate, without organic insulating film). As seen from FIGS. 1(a) and 1(b), only in Case D (without back gate, without organic insulating film), threshold voltage Vth shifts to the negative side, and the TFT transitions to an ON state when the applied voltage is 0 V.

Patent Document 3 discloses a configuration where the organic insulating layer has an opening region such that only part of the substrate (an outer perimeter portion of the display region) is not covered with the organic insulating layer. Note that, however, the semiconductor device described in Patent Document 3 does not intend to disclose that two types of TFTs, TFTs which are covered with the organic insulating layer and TFTs which are not covered with the organic insulating layer, are provided together on the same substrate.

Although the main points of one embodiment of the present invention have been described hereinabove, the present invention is not limited to this embodiment. Any other embodiment enables control of the threshold over all the TFTs. For example, in another embodiment of the present invention, a configuration may be employed where a back-gate electrode is provided in some of the TFTs while an organic insulating layer is not provided in all the TFTs including pixel TFTs and peripheral circuit TFTs. Note that, however, in this case, an oxide semiconductor layer which is a constituent of the channel of the TFTs is formed by a semiconductor layer consisting of two or more layers which have different mobilities. More specifically, it is preferred that, in the oxide semiconductor layer, the lower layer has a higher mobility than the upper layer that is in contact with the source electrode and the drain electrode. This arrangement enables to stabilize the element characteristics of the TFTs. Also, the back-gate electrode can be provided in TFTs which are to be severely controlled as to the threshold, for example the above-described buffer transistor, while the back-gate electrode is not provided in pixel TFTs.

Patent Document 4 discloses the technique of using an oxide semiconductor layer consisting of two layers which have different film qualities. However, this document does not intend to disclose providing together a configuration including a back-gate electrode and a configuration not including a back-gate electrode and controlling the threshold voltage with the use of an oxide semiconductor layer consisting of two or more layers which have different mobilities.

Hereinafter, more specific embodiments are described.

Embodiment 1

Figure 2:
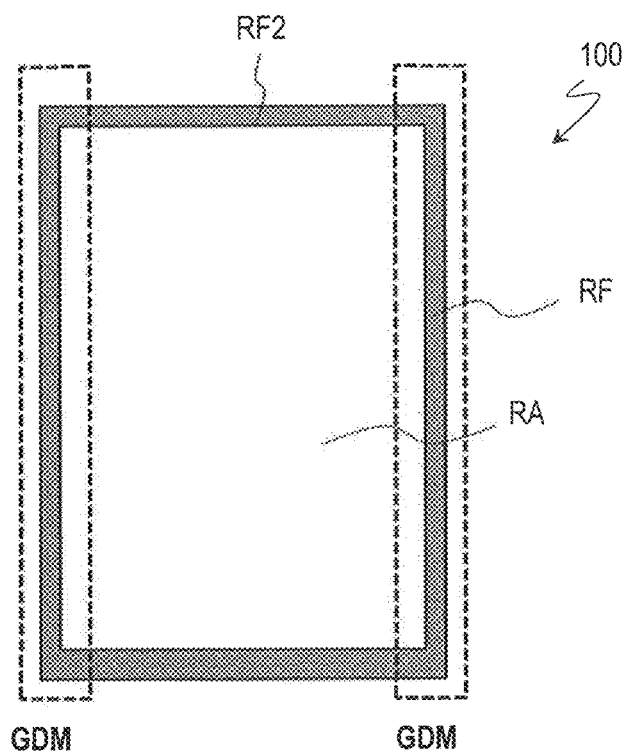
FIG. 2 A plan view showing a TFT substrate according to Embodiment 1 of the present invention.

FIG. 2 is a plan view showing a TFT substrate (active matrix substrate) 100 according to Embodiment 1. The TFT substrate 100 includes a display region (active area) RA in which a plurality of pixels are arranged in a matrix and a non-display region (frame region) RF surrounding the display region RA.

In the display region RA, a plurality of gate wires (scan lines) extending in a horizontal direction and a plurality of source wires (data lines) extending in a vertical direction so as to intersect with the gate wires are provided. Near the intersection of the gate wire and the source wire, an oxide semiconductor TFT (pixel TFT) which serves as a switching element is provided. In the non-display region RF, terminal portions and wires are provided. Note that, for example, the terminal wire region RF2 is arranged so as to surround the display region RA as shown in the drawing.

In the TFT substrate 100 of the present embodiment, gate drivers which are monolithically formed with the substrate are provided in part of the non-display region RF corresponding to the left and right sides of the TFT substrate 100. In FIG. 2, the regions in which the monolithic gate drivers are to be formed are shown as GDM regions. Note that, at the positions corresponding to the upper and lower sides, source drivers are provided by, for example, mounting semiconductor chips to connection terminals provided on the substrate. The source drivers may be monolithically formed on the substrate as are the gate drivers.

Figure 3:
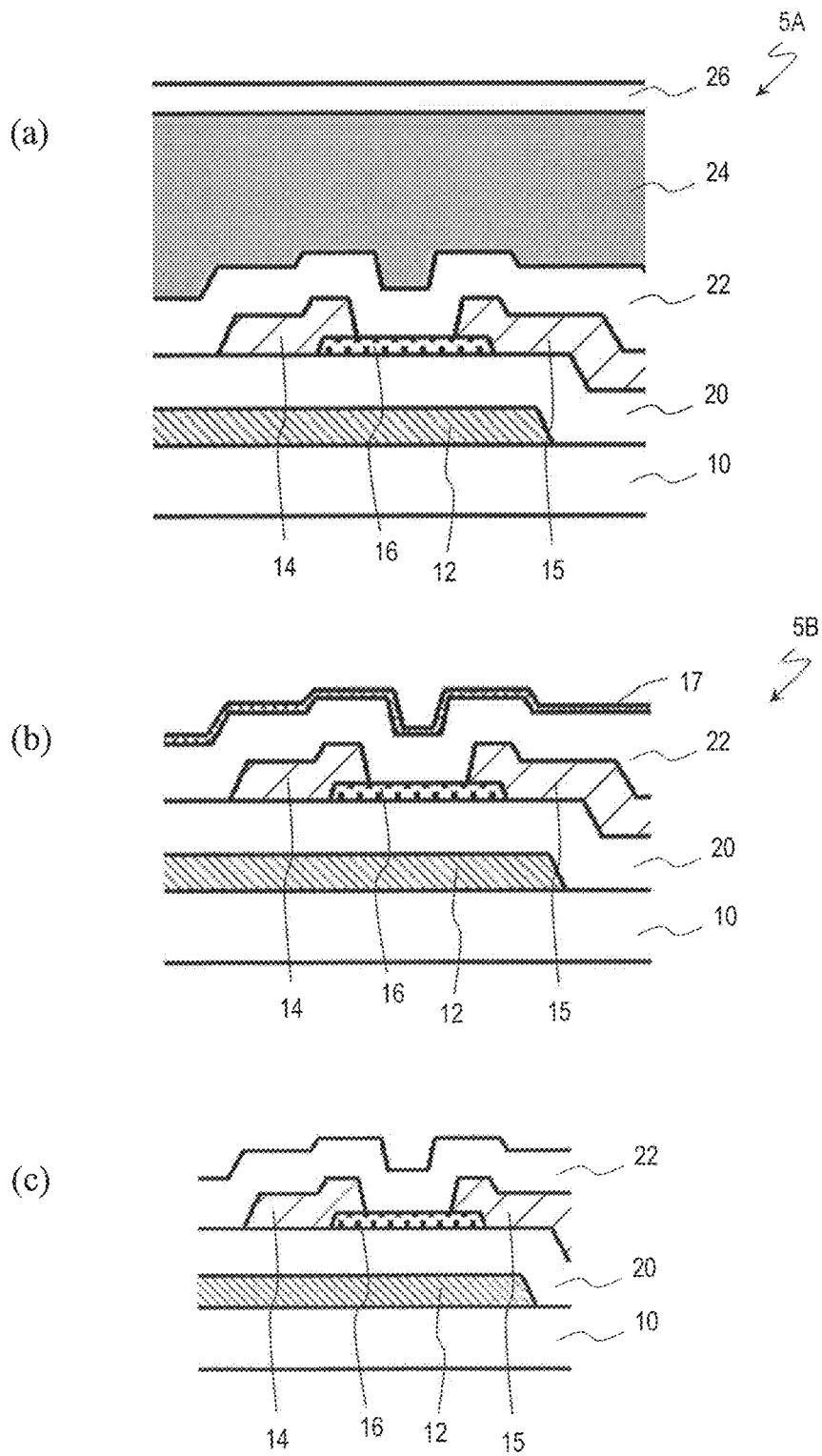
FIGS. 3 (a) and (b) respectively show a cross section of a pixel TFT and a cross section of a peripheral circuit TFT which are provided in the TFT substrate shown in FIG. 1. (c) shows as a reference example a configuration of a TFT which does not include a back gate or an organic insulating layer.

FIG. 3(a) is a cross-sectional view showing the configuration of a pixel TFT 5A provided in the display region RA. FIG. 3(b) is a cross-sectional view showing the configuration of a peripheral circuit TFT 5B provided in the non-display region RF. Note that FIG. 3(b) shows some of TFTs included in a gate driver provided in the non-display region RF as the peripheral circuit TFT 5B and, as a matter of course, a peripheral circuit TFT which has a different configuration may be included in the gate driver.

As shown in FIG. 3(a), the pixel TFT 5A includes, on a transparent substrate 10, a gate electrode 12, a gate insulating layer 20, an oxide semiconductor layer 16, a source electrode 14 and a drain electrode 15. The pixel TFT 5A is covered with a passivation layer 22 which serves as a protection layer. On the passivation layer 22, an organic insulating layer 24 is provided.

Meanwhile, as shown in FIG. 3(b), the peripheral circuit TFT 5B includes, as does the pixel TFT 5A, a gate electrode 12, a gate insulating layer 20, an oxide semiconductor layer 16, a source electrode 14 and a drain electrode 15 and is covered with a passivation layer 22. Note that, however, in some of the peripheral circuit TFTs, the TFTs 5B, for example buffer transistors, a back-gate electrode (second gate electrode) 17 is provided on the passivation layer 22.

Some of the peripheral circuit TFTs may have a configuration which does not include the back-gate electrode 17 and which is covered with the organic insulating layer 24 as shown in FIG. 3(a). For example, of the TFTs included in the gate driver, a TFT which does not have a sufficient space for the back-gate electrode 17 does not need to include the back-gate electrode 17.

In the present embodiment, on the TFT substrate 100, multiple types of TFTs 5A, 5B shown in FIGS. 3(a) and 3(b) are provided for different uses. In the peripheral circuit TFT 5B, the back-gate electrode 17 provided near the oxide semiconductor layer 16 is used to appropriately control the threshold voltage such that a suitable operation can be carried out. Since the back-gate electrode 17 is not provided in the pixel TFT 5A, decrease of the effective display region is prevented. Covering the pixel TFT 5A with the organic insulating layer 24 assures the operation of the pixel TFT 5A. Note that it is preferred that a TFT which does not have the back-gate electrode 17 and which is not covered with the organic insulating layer 24 such as shown in FIG. 3(c) is not provided because it can cause failure in operation.

Hereinafter, more specific examples of pixel TFTs and peripheral circuit TFTs provided in a TFT substrate for use in a transmissive liquid crystal panel and a manufacturing process of the TFTs are described with reference to FIGS. 4(a) to 4(c).

Figure 4:
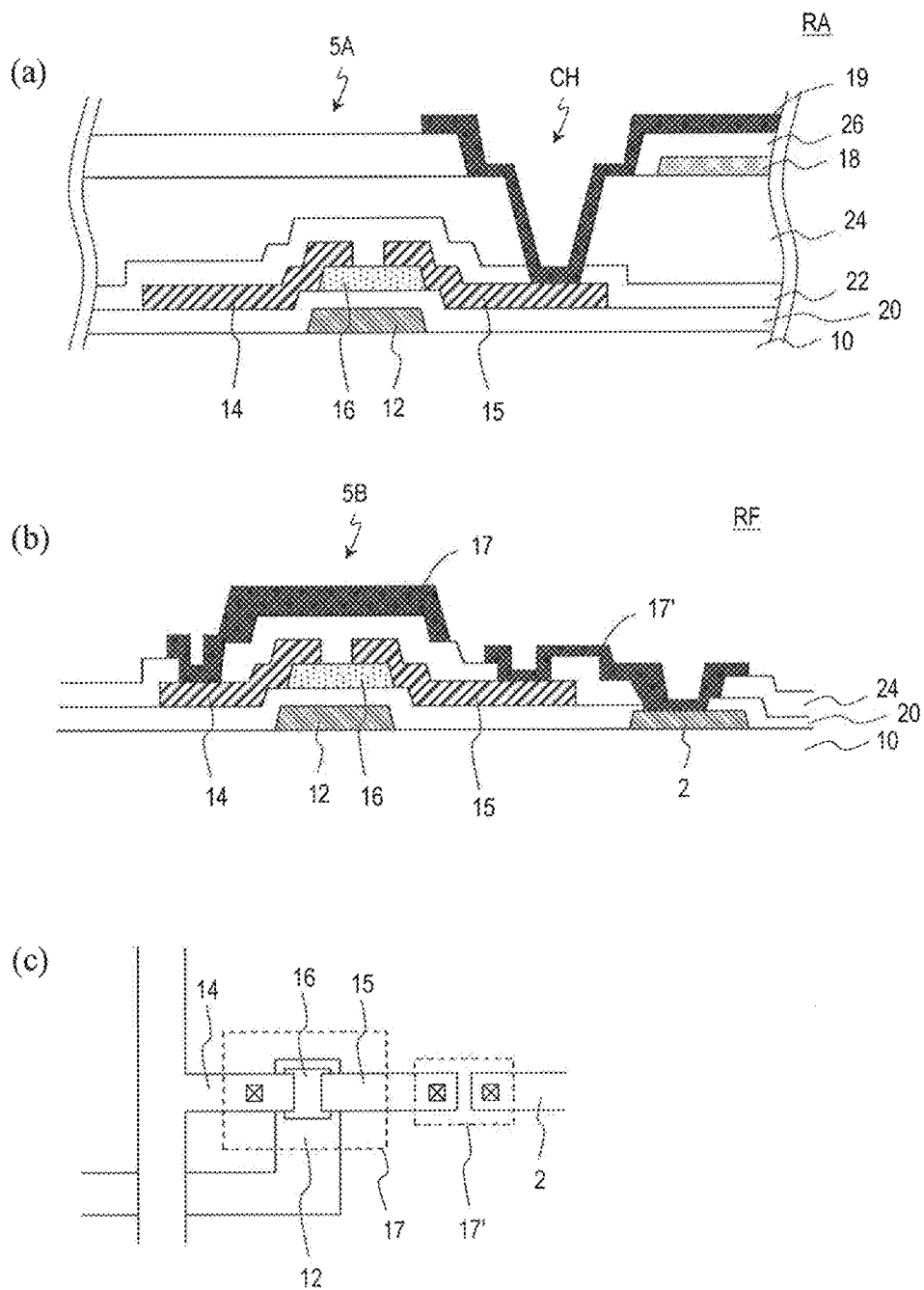
FIG. 4 Diagrams showing an example of the TFT substrate which is applied to a liquid crystal panel. (a) is a cross-sectional view showing a region around a pixel TFT. (b) is a cross-sectional view showing a region around a peripheral circuit TFT. (c) shows a plan view of (b).

FIGS. 4(a) and 4(b) respectively show regions around a pixel TFT 5A and a peripheral circuit TFT 5B which are provided in a TFT substrate for use in a liquid crystal panel. FIG. 4(c) is a plan view of the peripheral circuit TFT 5B shown in FIG. 4(b).

As shown in FIG. 4(a), the pixel TFT 5A is covered with the passivation layer 22 and the organic insulating layer 24. On the organic insulating layer 24, a transparent common electrode 18, a transparent insulating layer 26 covering the transparent common electrode 18, and a pixel electrode 19 formed on the transparent insulating layer 26 are provided. The drain electrode 15 of the pixel TFT 5A is electrically connected with the pixel electrode 19 in a contact hole CH.

The transparent common electrode 18 is insulated from the pixel electrode 19 with the transparent insulating layer 26. In this configuration, the transparent common electrode 18, the pixel electrode 19, and the insulating layer 26 form storage capacitance. The storage capacitance is utilized for holding the pixel voltage during a TFT off period. Note that, typically, the transparent common electrode 18 is arranged so as not to cover the pixel TFT 5A.

Meanwhile, as shown in FIG. 4(b), the peripheral circuit TFT 5B includes a back-gate electrode 17. As shown in FIG. 4(c), the back-gate electrode 17 is arranged so as to overlap the oxide semiconductor layer 16 when viewed in a direction normal to the substrate. The oxide semiconductor layer 16 is arranged so as to overlap the gate electrode 12. That is, the back-gate electrode 17 is arranged so as to overlap the gate electrode 12 with the oxide semiconductor layer 16 interposed therebetween.

The back-gate electrode 17 is utilized for controlling the threshold of the peripheral circuit TFT 5B. The back-gate electrode 17 is, for example, electrically connected with the source electrode 14 via a contact hole provided in the passivation layer 22 as shown in FIG. 4(b). In this case, the potential of the back-gate electrode 17 is kept equal to that of the source electrode 14. As will be described later, when the drain electrode 15 of the peripheral circuit TFT 5B is connected with a gate bus line 2 which is provided for inputting a gate signal to the gate electrode 12 of the pixel TFT 5A, the potentials of the source electrode 14 and the back-gate electrode 17 are kept at approximately 0 V (off voltage) during many periods except for gate-on periods of the pixel TFT 5A.

Note that, however, the peripheral circuit TFT 5B may have a different configuration, and the back-gate electrode 17 may be connected with the gate electrode 12. Alternatively, a separately-provided back-gate wire may be used such that an arbitrary voltage can be applied to the back-gate electrode 17.

As shown in FIGS. 4(b) and 4(c), the drain electrode 15 of the peripheral circuit TFT 5B that includes the back-gate electrode 17 may be connected with the gate bus line 2 via a connecting portion 17'. The gate bus line 2 is connected with the gate electrode 12 of the pixel TFT 5A in the display region and is configured such that, when the peripheral TFT 5B is in an ON state, a signal which is applied to the source electrode 14 of peripheral TFT 5B is supplied to the gate electrode 12 of the pixel TFT 5A.

In the configuration shown in FIGS. 4(a) and 4(b), the pixel TFT 5A and the peripheral circuit TFT 5B can be manufactured through a simultaneous process. In the peripheral circuit TFT 5B, the back-gate electrode 17 and the connecting portion 17' that connects the drain electrode 15 of the peripheral circuit TFT 5B with the gate bus line 2 can be formed simultaneously with the pixel electrode 19 or the transparent common electrode 18 by utilization of the step of forming the pixel electrode 19 that is connected with the pixel TFT 5A in the display region or the step of forming the transparent common electrode 18 that is for formation of storage capacitance.

Hereinafter, a specific manufacturing process is described.

First, a pixel TFT 5A in the display region RA and a peripheral circuit TFT 5B in the non-display region RF are formed by a known method. Note that a gate bus line 2 and a source bus line which is not shown in FIGS. 4(a) to 4(c) can also be formed by a known method.

Each of the TFTs 5A, 5B is covered with a passivation layer 22 by a known method. The passivation layer 22 is a 200-300 nm thick inorganic insulating layer formed by a SiO$_2$ film, for example. Thereafter, a 2-3 µm thick organic insulating layer 24 which is made of an organic photosensitive material is provided. The organic insulating layer 24 is patterned in a photolithography step. Here, the organic insulating layer 24 is arranged so as not to cover the peripheral circuit TFT 5B. In the vicinity of the pixel TFT 5A, a contact hole CH is provided, and the passivation layer 22 is etched with the use of the organic insulating layer 24 as a mask such that the drain electrode 15 can be exposed. In this process, a contact hole may be formed near the peripheral circuit TFT 5B such that a gate wire 2 is exposed. Also, a contact hole for connecting the back-gate electrode 17 of the peripheral circuit TFT 5B to the source electrode 14 may be provided in the passivation layer 22.

Thereafter, a transparent common electrode 18 is provided, and a transparent insulating layer 26 is provided. Further, a pixel electrode 19 is provided on the transparent insulating layer 26.

Here, the back-gate electrode 17 of the peripheral circuit TFT 5B can be formed in the step of forming the transparent common electrode 18 or the pixel electrode 19. In this case, the back-gate electrode 17 can be formed of a transparent electrically-conductive material, such as ITO (indium tin oxide) and IZO (indium zinc oxide), as is the transparent common electrode 18 or the pixel electrode 19. Also, the connecting portion 17' that is for connecting the drain electrode 15 of the peripheral circuit TFT 5B to the gate wire 2 can be formed of a transparent electrically-conductive material as is the back-gate electrode 17.

According to the above-described method, each of the TFTs 5A, 5B can be manufactured by utilization of a conventional manufacturing process of a TFT substrate for use in display devices without adding a new step of forming the back-gate electrode 17. Therefore, the above-described method is advantageous in terms of the cost.

The above-described oxide semiconductor layer 16 includes, for example, a semiconductor which is based on In—Ga—Zn—O elements (hereinafter, abbreviated as "In—Ga—Zn—O based semiconductor"). Here, the In—Ga—Zn—O based semiconductor is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. In the present embodiment, the oxide semiconductor layer 16 may be an In—Ga—Zn—O based semiconductor layer which includes In, Ga and Zn in a proportion of In:Ga:Zn=1:1:1, for example.

A TFT which includes an In—Ga—Zn—O based semiconductor layer has high mobility (20 times or more as compared with an a-Si TFT) and low current leakage (less than 1/100 as compared with an a-Si TFT) and is therefore suitably used as a driver TFT and a pixel TFT. When a TFT which includes an In—Ga—Zn—O based semiconductor layer is used, the power consumption of a display device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor in which the c-axis is oriented generally perpendicular to the layer surface is preferred. The crystalline structure of such an In—Ga—Zn—O based semiconductor is disclosed in, for example, Japanese Laid-Open Patent Publication No. 2012-134475 (Patent Document 1). The entire disclosure of Japanese Laid-Open Patent Publication No. 2012-134475 is incorporated by reference in this specification.

The oxide semiconductor layer 16 may include a different oxide semiconductor instead of the In—Ga—Zn—O based semiconductor. For example, the oxide semiconductor layer 16 may include a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like.

In the TFT substrate 100 described hereinabove, the threshold voltage is set to, for example, 0 to 5 V. Of the TFTs included in the monolithic gate drivers, the TFT 5B that includes the back-gate electrode 17 does not include an intervening organic insulating film. Therefore, the negative shift of the threshold voltage is sufficiently suppressed, and transition to a normally-on state is prevented. Meanwhile, in the pixel TFT 5A, the threshold is stabilized by the organic insulating layer 24. Note that, in the pixel TFT 5A, the gate voltage for off periods can be set to a low level. Therefore, the probability of transition to a normally-on state is low even in the absence of strict control by the back-gate electrode 17, and only covering the pixel TFT 5A with the organic insulating layer 24 enables the pixel TFT 5A to operate without any trouble.

Embodiment 2

In above-described Embodiment 1, the configuration which has a back gate such as shown in FIG. 3(b) is applied to some of the peripheral circuit TFTs which are strict about the margin of the threshold, for example buffer transistors, while the configuration which has no back gate such as shown in FIG. 3(a) is applied to the other TFTs.

In the present embodiment, the configuration which has a back gate such as shown in FIG. 3(b) is applied to all of the peripheral circuit TFTs 5B in the non-display region, while the configuration which has no back gate such as shown in FIG. 3(a) (except that it is covered with an organic insulating layer) is applied to all of the pixel TFTs in the display region.

In this configuration, only the display region RA is covered with the organic insulating layer, while the non-display region RF is not covered with the organic insulating layer. Further, all of the TFTs included in driver circuits include a back gate so that the operation can be stabilized.

When it is difficult to provide a back-gate electrode in every one of the peripheral circuit TFTs due to the area for arrangement, a back-gate electrode may be provided only in a TFT of which the margin of the threshold variation is particularly small as previously described in the section of Embodiment 1.

Embodiment 3

Figure 5:
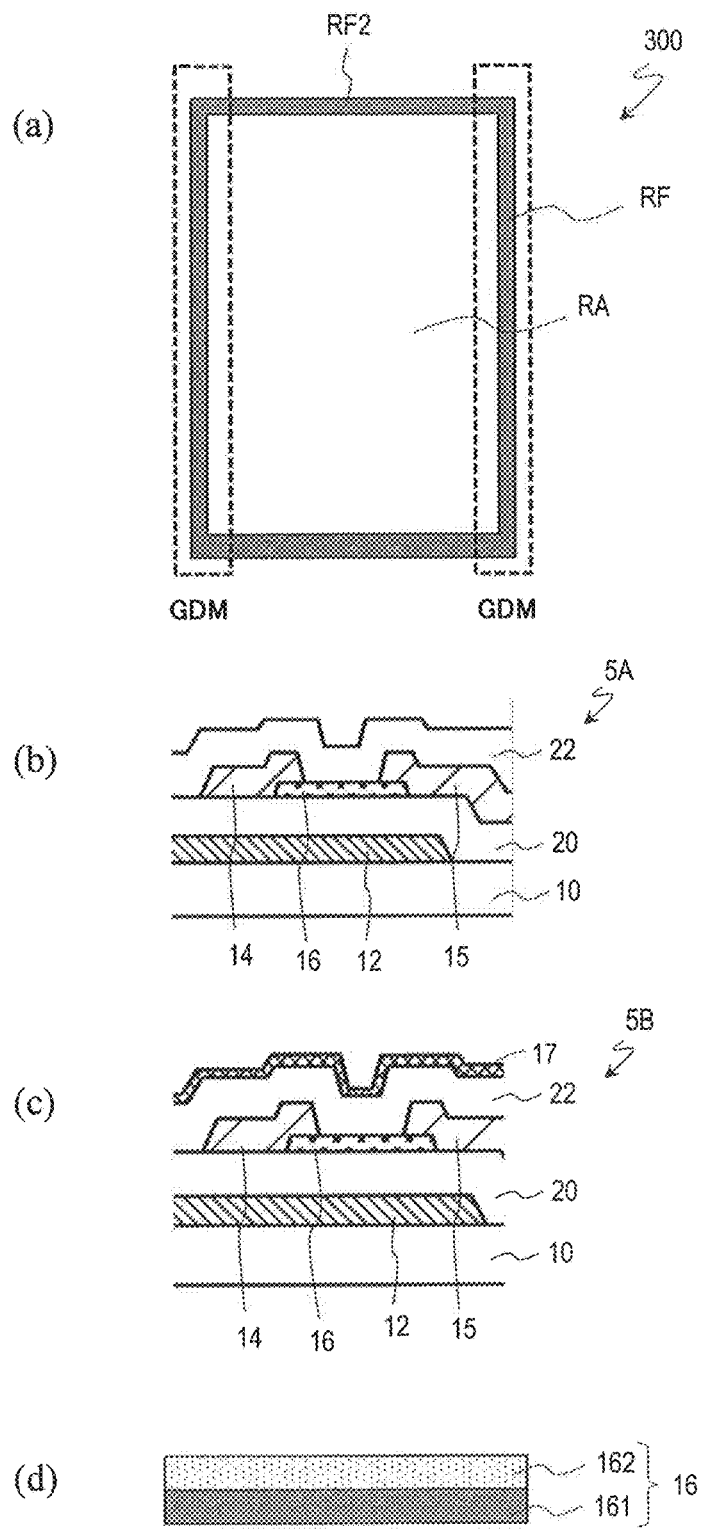
FIG. 5 Diagrams for illustrating a TFT substrate of Embodiment 3. (a) is a plan view of the TFT substrate. (b) and (c) are cross-sectional views of a pixel TFT and a peripheral circuit TFT, respectively. (d) is a cross-sectional view showing an oxide semiconductor layer.

FIG. 5(a) is a plan view showing a TFT substrate 300 of Embodiment 1. FIGS. 5(b) and 5(c) show cross sections of the pixel TFT 5A and the peripheral circuit TFT 5B.

In the present embodiment, none of the display region RA and the non-display region RF includes an organic insulating layer. That is, as shown in FIG. 5(b), in the pixel TFT 5A, no organic insulating layer is provided above the passivation layer 22. Also, in the peripheral circuit TFT 5B, no organic insulating layer is provided. However, in the peripheral circuit TFT 5B, a back-gate electrode 17 is provided for controlling the threshold variation.

Note that, however, in the present embodiment, in order to stabilize the threshold voltage, the oxide semiconductor layer 16 is formed by two layers, the first layer 161 which has a relatively high mobility and the second layer 162 which has a lower mobility than that of the first layer 161, as shown in FIG. 5(d). The first layer 161 which has the higher mobility is provided as the lower layer so as to be in contact with the gate insulating layer 20. The second layer 162 which has the lower mobility is provided as the upper layer so as to be exposed through the gap between the source electrode 14 and the drain electrode 15.

The first layer (lower layer) 161 which has the higher mobility and the second layer (upper layer) 162 which has the lower mobility can be realized by, for example, varying the composition ratio of elements that constitute the oxide semiconductor layer 16. For example, when an In—Ga—Zn—O based semiconductor is used as the oxide semiconductor layer 16, the mobility can be increased by increasing the concentration of In (or decreasing the concentration of Ga). Patent Document 4 discloses a configuration where two layers which have different In concentrations are provided in a TFT in which an In—Ga—Zn—O based semiconductor is used.

The above-described arrangement enables a TFT which does not need strict threshold control, for example pixel TFTs and some of peripheral circuit TFTs, to suitably operate even without an organic insulating layer. Meanwhile, in the other peripheral circuit TFTs which are strict about the threshold variation, the back-gate electrode 17 is provided such that the negative shift can be prevented and an appropriate operation can be carried out.

The reasons why the threshold shift can be suppressed by forming the oxide semiconductor layer 16 by two layers as described above are as follows.

In the upper layer portion of the oxide semiconductor layer 16, defects are produced in the film during source dry etching (source-drain separation step) and carriers are trapped, and as a result, threshold voltage Vth varies. In the case where the oxide semiconductor layer 16 that has a high mobility is realized by a single layer, carriers flow throughout that single layer. Film defects produced in the upper part of the first layer affect the flow of the carriers.

On the other hand, in the case where the oxide semiconductor layer has a two-layer structure, carriers are allowed to flow only through the first layer (lower layer) that has the higher mobility. That is, it is possible to reduce the probability that film defects produced in the upper part of the second layer (upper layer) affect the flow of carriers. In this way, rather than the upper layer that is in direct contact with the source electrode and the drain electrode, the lower layer that has the higher mobility and that has no defects is selectively utilized as a channel, whereby the variation of the threshold can be prevented.

The Ga concentration (atomic proportion) in the first layer that has the higher mobility is, for example, not more than 40 at % in compositional ratio. Alternatively, the first layer is configured such that In concentration≥Ga concentration holds. Meanwhile, the Ga concentration in the second layer that has the lower mobility is 30-50 at % in compositional ratio. Alternatively, the second layer is configured such that In concentration<Ga concentration holds. Note that, however, the compositional ratios of the respective layers are set such that the relationship of the Ga concentration of the first layer<the Ga concentration of the second layer (or the In concentration of the first layer>the In concentration of the second layer) is satisfied.

The first layer and the second layer which have different In or Ga concentrations can be realized as follows. For example, in the case where the In—Ga—Zn—O based semiconductor layer is formed by sputtering, the second layer is formed, after formation of the first layer, by sputtering with the use of a target which has a higher Ga concentration.

The thickness of the first layer as formed is set to, for example, 10 nm or more. The thickness of the second layer as formed is set to, for example, 20 nm or more. Note that, however, in the source-drain etching step, part of the second layer is also etched away. Thus, it is preferred that the thickness of the second layer as formed is arbitrarily set such that the thickness of the second layer remaining after the etching is greater than 0 nm.

Figure 6:
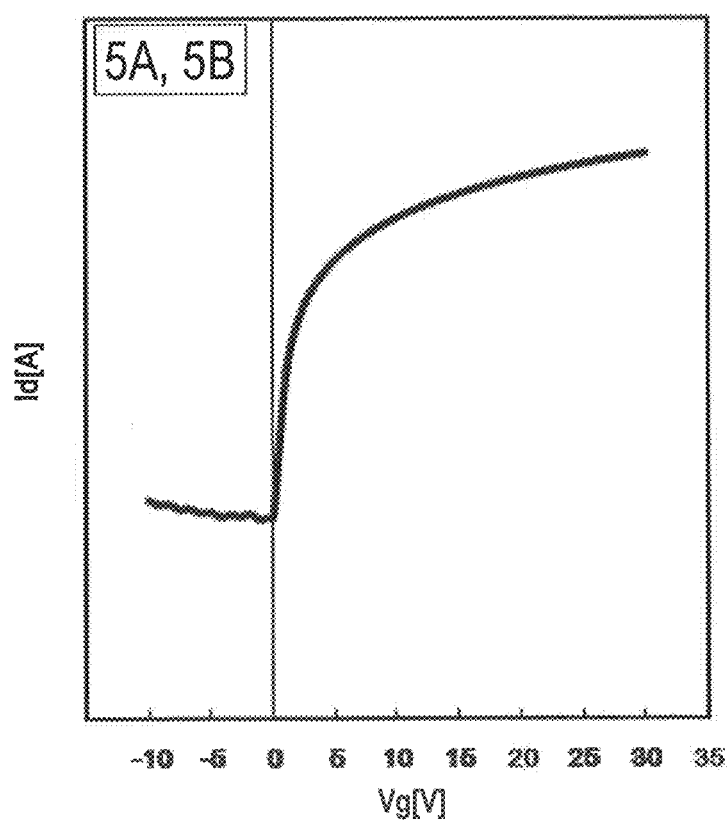
FIG. 6 A graph showing the threshold of an oxide semiconductor TFT in Embodiment 3.

By thus providing the oxide semiconductor layer 16 consisting of the two layers 161, 162, the variation of the threshold can be suppressed. FIG. 6 shows the threshold characteristics of the TFT 5A and the TFT 5B shown in FIGS. 5(b) and 5(c). As seen from FIG. 6, when the oxide semiconductor layer 16 consists of two layers, the threshold shift can be suppressed no matter which configuration the TFTs 5A, 5B have. According to experiments carried out by the present inventors, when the oxide semiconductor layer was formed by a single layer, the variation of the threshold was found to be about 3 V. When the oxide semiconductor layer was formed by two layers, the variation of the threshold was found to be not more than 1 V.

Although an embodiment which includes an oxide semiconductor layer consisting of two layers of different mobilities has been described in the foregoing section, the oxide semiconductor layer may consist of three or more layers. By providing a plurality of layers such that a layer which has a high mobility and which has no defect is selectively used as a channel, an appropriate operation can be realized.

Conventionally, the technique of providing an etching stopper for reducing etching damage to the oxide semiconductor layer before the process of separating the source electrode 14 and the drain electrode 15 by etching has been known. On the other hand, according to the present embodiment, excellent element characteristics can be obtained without an etching stopper, and therefore, the manufacturing process can advantageously be simplified.

The configuration of this Embodiment 3 where the oxide semiconductor layer consists of two layers of different mobilities may be applied to previously-described Embodiments 1 and 2. Thereby, the element characteristics of each TFT can be further improved.

As a matter of course, various modifications can be made to the embodiments of the present invention which have been described in the foregoing section. For example, in the TFT 5B which has been described in the foregoing section, the gate electrode 12 is provided under the oxide semiconductor layer 16 while the back-gate electrode 17 is provided above the oxide semiconductor layer 16. However, on the contrary, the gate electrode 12 may be provided above the oxide semiconductor layer 16 while the back-gate electrode 17 is provided under the oxide semiconductor layer 16.

In the foregoing section, a TFT of a top contact configuration has been described in which the upper surface of the semiconductor layer is in contact with the source electrode and the drain electrode. However, the TFT may have a bottom contact configuration where the lower surface of the semiconductor layer is in contact with the source electrode and the drain electrode.

As for the voltage applied to the back-gate electrode of an oxide semiconductor TFT included in the gate driver, for example, a TFT for monitoring may be provided for determining a shift of the threshold from the drain current value of this TFT. A voltage appropriate for compensating for this shift is applied to the back gate. Such a configuration is disclosed in WO 2014/042116 of the present applicant.

Although an active matrix substrate for use in a liquid crystal display device has been described in the foregoing section, an active matrix substrate for an organic EL display device can also be manufactured. In the organic EL display device, a light-emitting element in each pixel includes an organic EL layer, a TFT for switching, and a TFT for driving. A semiconductor device of an embodiment of the present invention can be used for these TFTs. Further, TFTs may be arranged in an array for use as a selection transistor, whereby a memory element (oxide semiconductor thin film memory) can also be realized. Also, it is applicable to an image sensor.

INDUSTRIAL APPLICABILITY

A semiconductor device of an embodiment of the present invention is suitably applicable to an active matrix substrate for use in a display device or the like.

REFERENCE SIGNS LIST 2 gate wire
5A, 5B TFT (oxide semiconductor TFT)
10 substrate 12 gate electrode
14 source electrode
15 drain electrode
16 oxide semiconductor layer
17 back-gate electrode
20 gate insulating layer
22 passivation layer
24 organic insulating layer
18 transparent common electrode
19 pixel electrode
100 TFT substrate
RA display region
RF non-display region

The invention claimed is:

1. A semiconductor device, comprising:
a substrate;
a plurality of oxide semiconductor thin-film transistors (TFTs) provided on the substrate, each of the plurality of oxide semiconductor TFTs including a first gate electrode, a first insulating layer which is in contact with the first gate electrode, an oxide semiconductor layer arranged so as to oppose the first gate electrode via the first insulating layer, and a source electrode and a drain electrode which are connected with the oxide semiconductor layer;
a second insulating layer covering the oxide semiconductor layer, the source electrode, and the drain electrode of the each of the plurality of oxide semiconductor TFTs, the second insulating layer is a single layer that is in direct contact with each of a channel region of the oxide semiconductor layer, the source electrode, and the drain electrode;
an organic insulating layer provided on the second insulating layer covering only some of the plurality of oxide semiconductor TFTs;
a display region in which a plurality of pixels are arranged; and
a non-display region surrounding the display region, wherein the oxide semiconductor layer includes:
a first semiconductor layer that is provided on a side close to the first gate electrode, the first semiconductor layer having a first mobility, and
a second semiconductor layer that is in contact with the first semiconductor layer and is provided on a side distant from the first gate electrode, the second semiconductor layer having a second mobility that is lower than the first mobility,
the plurality of oxide semiconductor TFTs include a first TFT that is covered with the organic insulating layer and provided in the display region, a second TFT that is not covered with the organic insulating layer and provided in the non-display region, and a third TFT provided in the non-display region and separate from the second TFT,
the second TFT further includes a second gate electrode arranged so as to oppose the oxide semiconductor layer via the second insulating layer, when viewed in a direction normal to the substrate, the second gate electrode being arranged so as to overlap with at least a portion of the first gate electrode with the oxide semiconductor layer interposed therebetween, and
the first TFT and the third TFT do not include any second gate electrode arranged so as to oppose the oxide semiconductor layer via the second insulating layer.

2. The semiconductor device of claim 1, wherein
the organic insulating layer is arranged so as to selectively cover only the display region,
the first TFT is included in one of the plurality of pixels in the display region, and
the second TFT is included in a gate driver integrally defined on the substrate in the non-display region.

3. The semiconductor device of claim 1, further comprising a transparent electrode provided above the organic insulating layer, wherein the second gate electrode is made of a same material as that of the transparent electrode.

4. The semiconductor device of claim 1, wherein the second gate electrode is electrically connected to wires to apply separate voltages to the source electrode, the first gate electrode, and the second gate electrode of the second TFT.

5. The semiconductor device of claim 1, wherein the oxide semiconductor layer includes an In—Ga—Zn—O based semiconductor.

6. The semiconductor device of claim 5, wherein the In—Ga—Zn—O based semiconductor includes a crystalline portion.

7. A semiconductor device, comprising:
a substrate;
a plurality of oxide semiconductor thin-film transistors (TFTs) provided on the substrate, each of the plurality of oxide semiconductor TFTs including a first gate electrode, a first insulating layer which is in contact with the first gate electrode, an oxide semiconductor layer arranged so as to oppose the first gate electrode via the first insulating layer, and a source electrode and a drain electrode which are connected with the oxide semiconductor layer;
a second insulating layer covering the oxide semiconductor layer, the source electrode, and the drain electrode of the each of the plurality of oxide semiconductor TFTs, the second insulating layer is a single layer that is in direct contact with each of a channel region of the oxide semiconductor layer, the source electrode, and the drain electrode;
a display region in which a plurality of pixels are arranged; and
a non-display region surrounding the display region, wherein
the oxide semiconductor layer includes a first semiconductor layer which is provided on a side close to the first gate electrode, the first semiconductor layer having a first mobility, and a second semiconductor layer which is in contact with the first semiconductor layer and which is provided on a side distant from the first gate electrode, the second semiconductor layer having a second mobility which is lower than the first mobility,
the plurality of oxide semiconductor TFTs include a first TFT provided in the display region, a second TFT provided in the non-display region, and a third TFT provided in the non-display region and separate from the second TFT,
the second TFT includes a second gate electrode arranged so as to oppose the oxide semiconductor layer via the second insulating layer, when viewed in a direction normal to the substrate, the second gate electrode being arranged so as to overlap with at least a portion of the first gate electrode with the oxide semiconductor layer interposed therebetween, and
the first TFT and the third TFT do not include any second gate electrode arranged so as to oppose the oxide semiconductor layer via the second insulating layer.

8. The semiconductor device of claim 7, wherein the second TFT is included in a gate driver provided in the non-display region, and the first TFT is included in a pixel provided in the display region.

9. The semiconductor device of claim 7, wherein the first semiconductor layer has a thickness of not less than 10 nm, and the second semiconductor layer has a thickness of not less than 20 nm.

10. The semiconductor device of claim 7, wherein a Ga concentration in the second semiconductor layer is higher than a Ga concentration in the first semiconductor layer.

* * * * *